United States Patent [19]
Sato et al.

[11] Patent Number: 5,488,325
[45] Date of Patent: Jan. 30, 1996

[54] TIMING GENERATOR INTENDED FOR SEMICONDUCTOR TESTING APPARATUS

[75] Inventors: Masatoshi Sato, Gyoda; Noriyuki Masuda, Ageo, both of Japan

[73] Assignee: Advantest Corporation, Tokyo, Japan

[21] Appl. No.: 324,684

[22] Filed: Oct. 18, 1994

[30] Foreign Application Priority Data

Oct. 18, 1993 [JP] Japan .................................. 5-061023 U

[51] Int. Cl.[6] .................................................. H03K 5/135
[52] U.S. Cl. ........................ 327/286; 327/279; 326/93
[58] Field of Search ......................... 326/16, 93; 327/265, 327/273, 279, 286

[56] References Cited

U.S. PATENT DOCUMENTS

| | | | |
|---|---|---|---|
| 4,400,666 | 8/1983 | Sekiguchi | 327/286 |
| 4,745,310 | 5/1988 | Swapp | 327/286 |
| 4,837,521 | 6/1989 | Herlein et al. | 327/286 |
| 5,095,232 | 3/1992 | Hirano et al. | 327/286 |
| 5,418,479 | 5/1995 | Sambandain | 326/93 |

Primary Examiner—Edward P. Westin
Assistant Examiner—Benjamin D. Driscoll
Attorney, Agent, or Firm—Knobbe, Martens, Olson & Bear

[57] ABSTRACT

A timing generator for generating delay timing signals which have delay time up to n-times of a reference clock period is capable of considerably reducing the hardware size. The timing generator is used in a semiconductor testing apparatus. The timing generator can contribute to reduce the total size and cost of the semiconductor testing apparatus. The timing generator includes a counter for counting the reference clock, an adder for adding the output of the counter to delay data, a series of registers for storing the output of the adder and shifting the output of the adder in synchronism with a delay trigger signal, a series of exclusive OR gates for comparing each output of the registers with the output of the counter and generating coincidence signals when the output from the register and the counter coincide with each other, and an OR gate for receiving the outputs of the exclusive OR gates and generating a signal which is combined of the outputs from the exclusive OR gates.

1 Claim, 4 Drawing Sheets

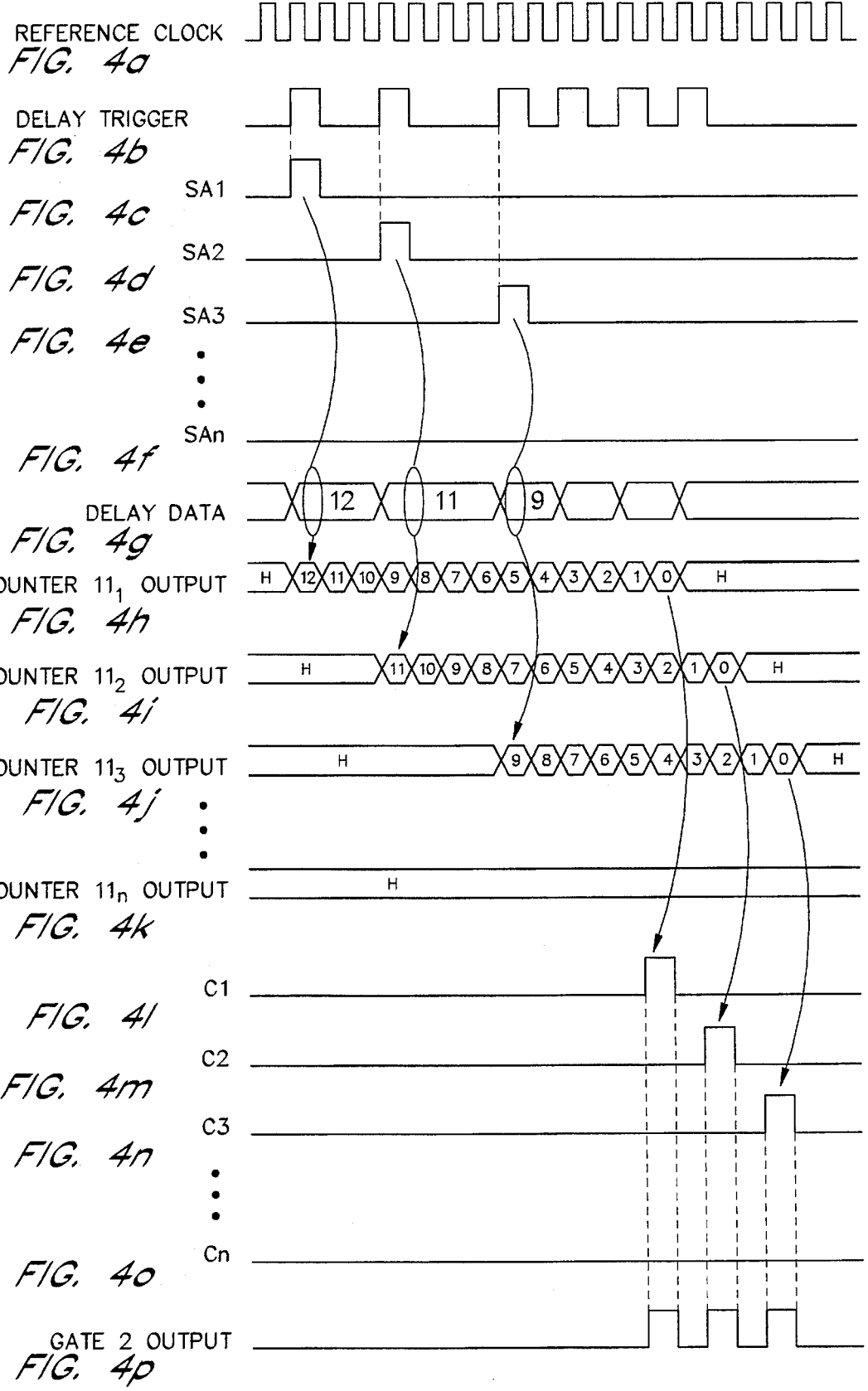

5,488,325

1

TIMING GENERATOR INTENDED FOR SEMICONDUCTOR TESTING APPARATUS

FIELD OF THE INVENTION

This invention relates to a timing generator to be used in a semiconductor testing apparatus to determine various timings of test signals, and more particularly to a timing generator which is capable of considerably decreasing the size of a circuit configuration for generating timing signals having variable delay times from zero to n-times of a period of a reference clock.

BACKGROUND OF THE INVENTION

Conventionally a timing generator employed in a semiconductor testing apparatus has utilized a counter to obtain a desired delay time, and further, an n-phase interleave circuit to produce a delay time up to n-times longer delay than a reference clock period. Furthermore, this counter has achieved a required delay by counting k bits of the reference clock.

FIG. 3 is a block diagram showing an example of a delay circuit configured by counters to be used in the conventional timing generator for a semiconductor testing apparatus. In FIG. 3, first, an n-phase interleave controller 1 is provided to divides a delay trigger signal at its input into n-phases and distributes them to counters. The n-phase interleave controller detects the presence or absence of the delay trigger for each period of the reference clock provided at the other input. If the delay trigger is present, the output of the n-phase interleave controller is advanced by one step. If the output reaches a value n, it goes back to 1 and begins to advance from 1 again.

Counters $11_1$–$11_n$ are provided in a parallel fashion for generating n-phase delay signals. Outputs C1–Cn of the counters $11_1$–$11_n$ are connected to an OR circuit 2. Each counter is provided with delay data and the reference clock. Each counter also has input terminals SA and SB. The input terminal SA receives the delay trigger signal from the n-phase interleave controller 1 and the input terminal SB receives an output signal of the corresponding counter. When the delay trigger signal from the n-phase interleave control 1 exists at the input terminal $SA_1$ terminal of the counter $11_1$, for example, the delay data is loaded in the counter $11_1$. The counter $11_1$ operates according to the delay data, for example, presets its state to the value indicated in the delay data. The delay data consists of k bits, which is typically on the order of 10 bits.

Initially, the outputs C1–Cn of the counters $11_1$–$11_n$ are Low. Thus, in the counter $11_1$, the output C1 is in the low level and supplied to the OR gate 2 and the input terminal $S_1$. When both input signals at the terminals SA and SB are Low, the counter 11 decrements. That is, whenever the reference clock is supplied, loaded data in the counter will be decremented. If the loaded data reaches 0, the output C and thus the input terminal SB become high, and then the counter 11 is set to a hold mode. The counter 11 maintains the hold mode until receiving the next delay trigger signal from the n-phase interleave controller 1.

FIG. 4 is a timing chart for showing an operation of the delay circuit of FIG. 3. The n-phase interleave controller 1 is given the reference clock and the delay trigger signal as shown in FIGS. 4A and 4B, respectively. The n-phase interleave controller 1 then divides and distributes the delay trigger signal to the terminals $SA_1$–$SA_n$ of the counters $11_1$–$11_n$ as shown in FIGS. 4C–4N. The delay data corresponding to the first delay trigger signal at the terminal $SA_1$ (FIG. 4C) from the n-phase interleave controller 1 is loaded in the counter $11_1$.

In the example of FIG. 4, the delay data for the counter $11_1$ is "12" (FIG. 4G) and thus the counter $11_1$ is set to the value "12". Then the counter $11_1$ decrements from 12 by one step for each reference clock of FIG. 4A until it reaches 0 (FIG. 4H). When the counter $11_1$ becomes 0, by counting the reference clock 12 times, the output C1 becomes high. Similarly, the delay data corresponding to the second delay trigger at the terminal $SA_2$ is loaded in the counter $11_2$. In this example, delay data indicates "11" (FIG. 4G) so that the counter $11_2$ is set to "11". The counter $11_2$ decrements from 11 to 0 by the timing of the reference clock interval. The output C2 of the counter $11_2$ becomes high after counting the reference clock 11 times (FIG. 4I).

In the similar manner, the delay data corresponding to the third delay trigger at the terminal $SA_3$ is loaded in the counter $11_3$. The delay data for the counter $11_3$ indicates "9" (FIG. 4G) so that the counter $11_2$ is set to "9". The counter $11_3$ decrements from 9 to 0 step by step for each reference clock of FIG. 4A. The output C2 of the counter 113 becomes high after counting the reference clock 9 times (FIG. 4I). The outputs C1–Cn shown in FIGS. 4L–4O are coupled by the OR circuit 2 which generates the timing signal of FIG. 4P whose delay time is controlled by factors k and n of the reference clock.

The example of FIGS. 3 and 4 show only a part of the circuit configuration for one test pin for a IC device to be tested. For example, this circuit determines a timing (an edge) when a test signal for the IC device under test changes its state. In the semiconductor testing apparatus, each test pin requires several kinds of timing edges for generating complex test signals. That is, even for one test pin in the semiconductor testing apparatus, more than four or five circuits shown in FIG. 3 must be installed. The semiconductor testing apparatus is required to have the number of test pins equal to or greater than the number of an IC device pins.

Since some of the recent IC devices have device pins as many as several hundreds, the total number of delay circuits shown in FIG. 3 required in the semiconductor testing apparatus becomes extremely large. Especially, as the delay data k increases, the circuit size increases. Moreover, as the number of interleave phase n increases, the circuit scale further increases.

Therefore, the conventional timing generator for use in the semiconductor testing apparatus has the following disadvantages. The circuit size of the delay circuit increases with the increase of the number of interleave phase n, since the number of counters equal to n has to be installed in the delay circuit. In addition, the circuit size has to be increased corresponding to the increase in the number of device pins of IC device to be tested. Thus, the circuit structure in the conventional timing generator requires a large amount of hardware in the semiconductor testing apparatus and as a consequence increases the cost of the testing apparatus.

SUMMARY OF THE INVENTION

The present invention is to improve the problems of the conventional technology described above. In other words, the present invention is to provide a timing generator to be used in a semiconductor testing apparatus, and more particularly to provide a timing generator of which a delay generator circuit is composed of reduced size of hardware circuits for producing a delay up to n-times of a period of a reference clock to be used as a trigger.

The delay generator comprises a counter for counting the reference clock, an adder for adding the output of the counter to delay data, a series of registers for storing the output of the adder and shifting the output of the adder in synchronism with a delay trigger signal, a series of exclusive OR gates for comparing each output of the registers with the output of the counter and generating coincidence signals when the output from the register and the counter coincide with each other, and an OR gate for receiving the outputs of the exclusive OR gates and generating a signal which is combined of the outputs from the exclusive OR gates.

According to the present invention, the delay circuit can memorize up to n numbers of delay time information by responding to n numbers of delay trigger signals. The data in the registers representing numerical value are stored and shifted in sequence in response to the delay trigger signal. The OR gate combines all of the coincidence signals from the exclusive OR gates and generates delayed timing signals at its output.

BRIEF DESCRIPTION OF THE PREFERRED EMBODIMENT

FIG. 4 is a timing chart showing the operation of the conventional delay circuit of FIG. 3.

DETAILED DESCRIPTION OF THE PREFERRED EMBODIMENT

Figure 1:
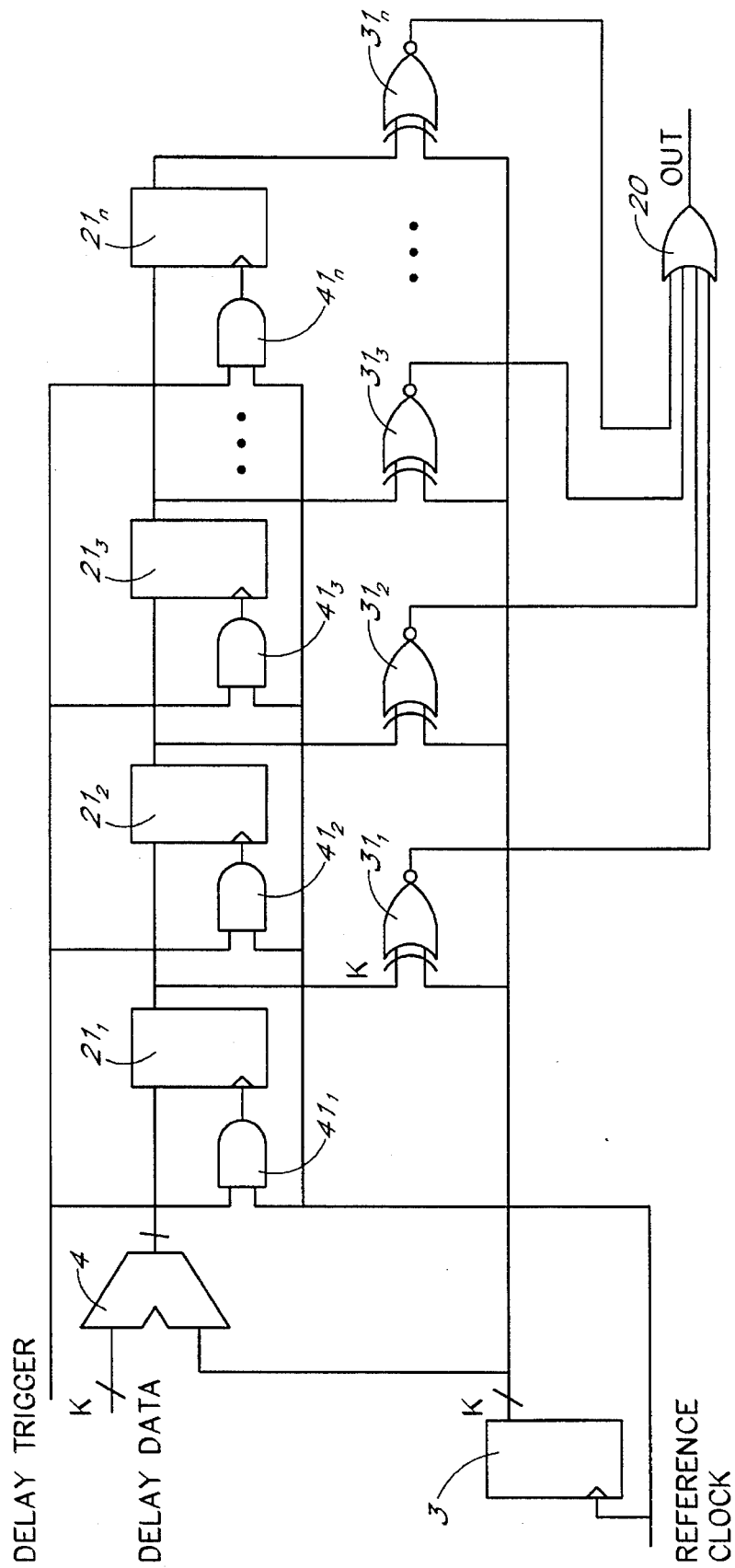
FIG. 1 is a block diagram showing the configuration of the delay circuit to be used in the timing generator of the present invention.

Referring to the drawings, an embodiment of the present invention will be described. FIG. 1 is a block diagram showing circuit configuration of a delay circuit of an embodiment in accordance with the present invention.

As shown in FIG. 1, The delay circuit of the present invention includes a k-bit counter 3, an adder 4, AND gates $41_1$–$41_n$, k-bit registers $21_1$–$21_n$, k-bit exclusive OR gates $31_1$–$31_n$ and an OR gate 20. A reference clock is supplied to the counter 3 and each input of the AND gates $41_1$–$41_n$. The AND gates $41_1$–$41_n$ are also provided with delay trigger signal. The registers $21_1$–$21_n$ and the exclusive OR gates $31_1$–$31_n$ are connected in a series manner as shown in FIG. 1. The outputs of the exclusive OR gates $31_1$–$31_n$ are connected to the OR gate 20.

The counter 3 operates in synchronism with the reference clock and increments by each pulse of the reference clock. After the counter 3 increments up to MSB (the most significant bit, which is k), a count value is changed to LSB (the least significant bit, which is 0), and counts up again by each occurrence of the reference clock. This process of incrementing the counter 3 is repeated during which the reference clock is given to the counter 3.

The adder 4 is provided with the output of the counter 3 and delay data which determine the delay time of the delay circuit. The adder 4 outputs the sum of the output of the counter 3 and the delay data. The output end of the adder 4 is connected to a data input terminal of the register $21_1$. A trigger terminal of the register $21_1$ is connected to an output of the AND gate $41_1$. The delay trigger signal is applied to an input terminal of the AND gate $41_1$, and the reference clock signal is applied to another input terminal of the AND gate $41_1$. Accordingly, the output data from the adder 4 is stored in the register $21_1$ every time when the AND gate $41_1$ detects the delay trigger in synchronization with the reference clock.

The output of the register $21_1$ is connected to one of the input of the exclusive OR gate $31_1$. The other input of the exclusive OR gate $31_1$ is provided with the output signal of the counter 3 which repeatedly counts up the reference clock as described above. Accordingly, the exclusive OR gate $31_1$ compares the output of the register $21_1$ with the output of the counter 3. If both the outputs described above coincide with each other, the output of the exclusive OR gate $31_1$ generates a coincidence signal at its output.

The register $21_2$, the AND gate $41_2$, and the exclusive OR gate $31_2$ are similarly provided at the next stage of the register $21_1$. The output terminal of the register $21_1$ is connected to an input terminal of the register $21_2$. Accordingly, data stored in the register $21_1$ is shifted to the register $21_2$ every time when the delay trigger signal is input to the registers $21_1$ and $21_2$. The register 21 stores the output data of the adder 4 at the time the delay trigger signal is given thereto. The exclusive OR gate $31_2$ compares the output of the register $21_2$ with the output of the counter 3. When the two outputs of the counter 3 and the register $21_2$ coincide with each other, the exclusive OR gate $31_2$ generates a coincidence signal at its output.

In a similar manner, the registers $21_3$–$21_n$, the AND gates $41_3$–$41_n$, and the exclusive OR gates $31_3$–$31_n$ are provided to function in such a way as described above. This circuit configuration is enabled so as to memorize the delay data corresponding to n trigger pulses. Accordingly, whenever the value of the counter coincides with the value of the registers, the coincidence signals are generated in sequence. The outputs of the exclusive OR gates $31_1$–$31_n$ are input to the OR gate 20 which generates a combined signal of the received signals. As described above, an output signal of the OR gate 20 can be obtained when the data (a register value) added in the adder 4 coincides with the data from the counter 3. As shown in FIG. 1, n numbers of registers can support up to n numbers of delay triggers to determine n numbers of delay times.

Figure 2:
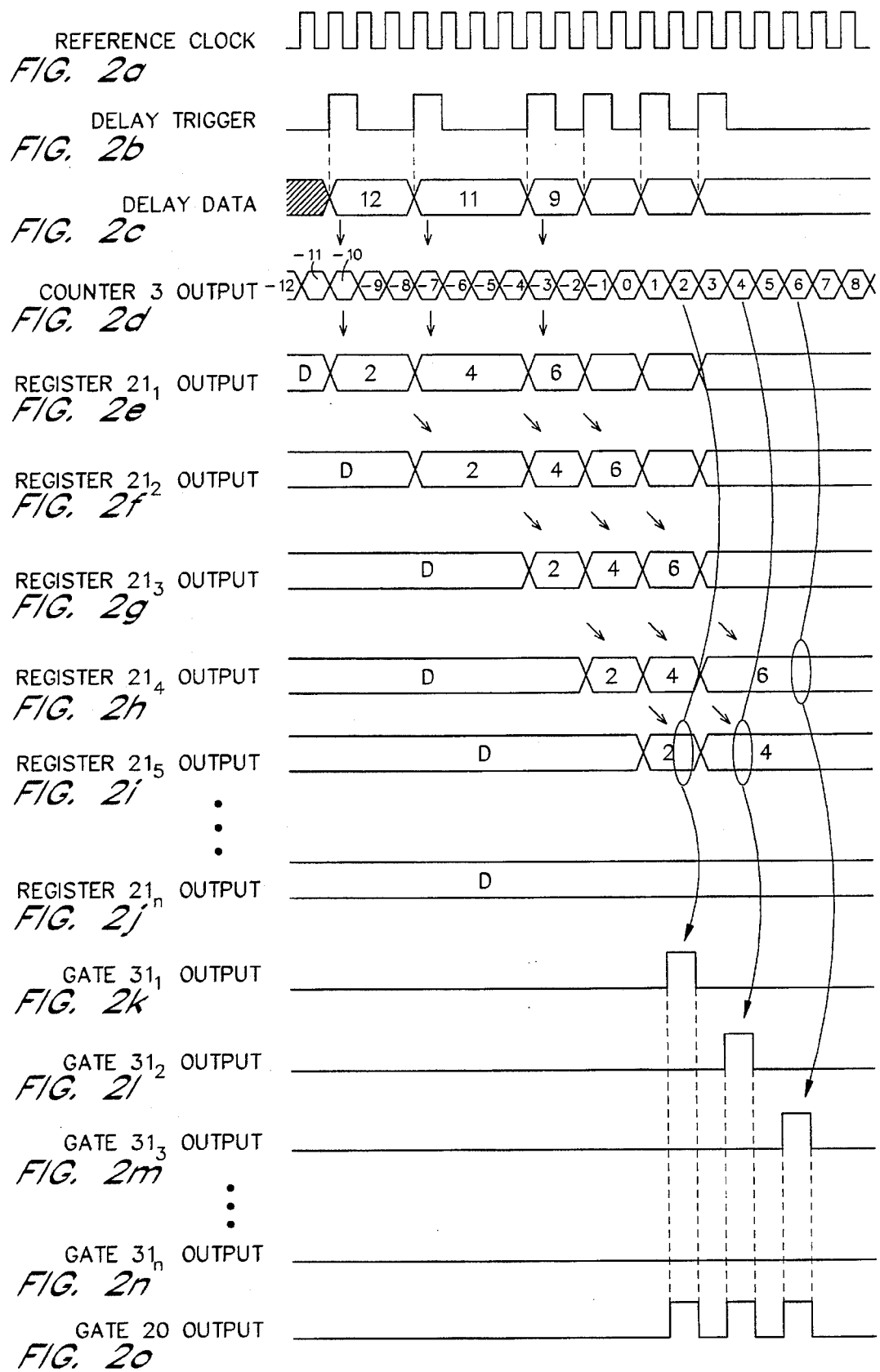
FIG. 2 is a timing chart showing the operation of the present invention of FIG. 1.
Figure 3:
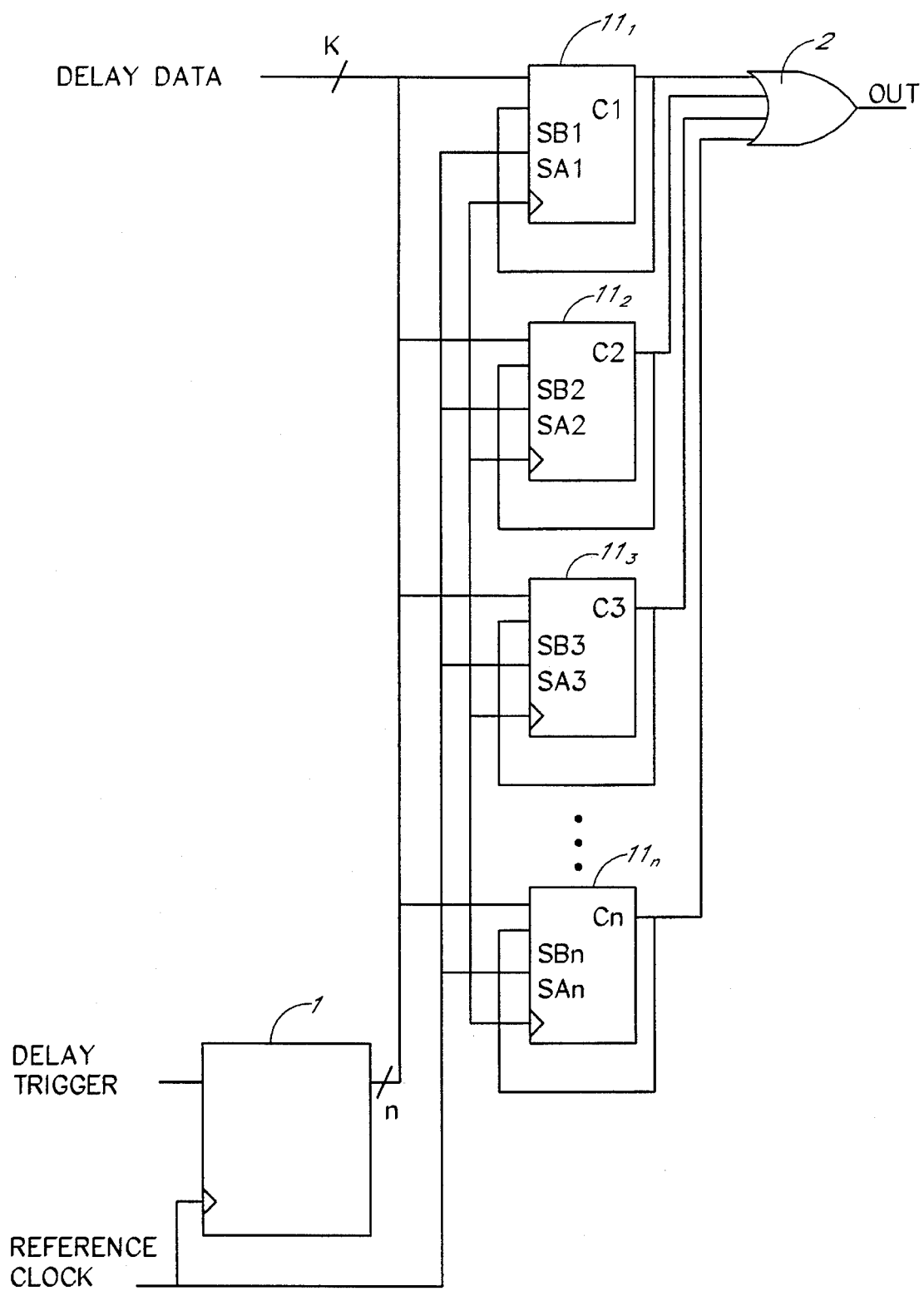
FIG. 3 is a block diagram showing the conventional configuration of the delay circuit in the timing generator.

FIG. 2 is a timing chart showing the operation of the present invention. The counter 3 continuously increments (FIG. 2D) by receiving the reference clock of FIG. 2A. When the count value becomes the most significant bit "k", the count value returns to the least significant bit "0", and the counter 3 increments again. The delay data (FIG. 2C) and the counted value (FIG. 2D) at the time when the delay trigger are added by the adder 4 and the output from the adder 4 and stored in the register $21_1$ (FIG. 2E). Then the exclusive OR gates $31_1$–$31_n$ generate a coincidence signal when the data from either one of the registers $21_1$–$21_n$ coincides with the count value of the counter 3 as shown in FIGS. 2K–2M. The coincidence signals from the exclusive OR gates $31_1$–$31_n$ are combined by the OR gate 20 which generates a delayed timing signal as shown in FIG. 20.

Incidentally, in FIG. 2D, the output data of the counter 3 indicates negative numbers. In this example, $-1$ corresponds to a full count number n, and $-2$ equals to $(n-1)$. Generally, in this example, $-x$ equals to $(-x+n+1)$. Accordingly, in case where the delay data indicate 12, the added value is $(n-9)+12=n+3$. Since the highest bit will be carried over and disappeared, the value to be input to the register $21_1$ is $n+3-(n+1)=2$.

As above described, according to the present invention, the counter 3 and adder 4 composing the timing generator do not depend on the value of n. Even if the number n is increased, only the registers $21_n$ is correspondingly increased. Since the number of LSI cells forming a register is considerably smaller than that of a counter, the total scale of hardware forming the delay circuit becomes smaller than that of the conventional configuration.

The configuration of the present invention described above produces the following effect. By utilizing registers that are smaller in scale than counters in the circuit of the delay generator for producing delay time up to n-times as long as a period of a periodical signal used as a trigger, the timing generator intended for the semiconductor testing apparatus can be made of a fewer number of LSI cells with low cost.

What is claimed is:

1. A timing generator used in a semiconductor testing apparatus for generating delay timing signals which delay up to n-times of a period of a reference clock, comprising:

a counter for counting the reference clock:

an adder for adding the output of said counter to delay data;

a series of registers for storing the output of said adder and shifting said output of said adder in synchronism with a delay trigger signal;

a series of exclusive OR gates for comparing each output of said registers with the output of said counter and generating coincidence signals when said output from said register and said counter coincide with each other; and an OR gate for receiving the outputs of said exclusive OR gates and generating a signal which is combined of said outputs from said exclusive OR gates.

* * * * *